(12) United States Patent
Tang et al.

(10) Patent No.: US 11,097,306 B2
(45) Date of Patent: Aug. 24, 2021

(54) SUPPORT FOR BONDING A WORKPIECE AND METHOD THEREOF

(71) Applicants: Hao Tang, Chino Hills, CA (US); Zhoujie Zhang, Ningbo (CN)

(72) Inventors: Hao Tang, Chino Hills, CA (US); Zhoujie Zhang, Ningbo (CN)

(73) Assignee: Micro Materials Inc., Camarillo, CA (US)

(*) Notice: Subject to any disclaimer, the term of this patent is extended or adjusted under 35 U.S.C. 154(b) by 699 days.

(21) Appl. No.: 14/797,122

(22) Filed: Jul. 11, 2015

(65) Prior Publication Data
US 2016/0167358 A1   Jun. 16, 2016

(30) Foreign Application Priority Data
Dec. 12, 2014 (CN) .......................... 201410766550.4

(51) Int. Cl.
*B32B 43/00* (2006.01)
*B05D 1/28* (2006.01)
(Continued)

(52) U.S. Cl.
CPC .............. *B05D 1/28* (2013.01); *B05D 1/005* (2013.01); *B05D 1/02* (2013.01); *B05D 1/18* (2013.01); *B05D 1/30* (2013.01); *B05D 1/32* (2013.01); *H01L 21/6835* (2013.01); *B32B 38/10* (2013.01); *B32B 43/006* (2013.01);
(Continued)

(58) Field of Classification Search
CPC ....... H01L 23/15; B32B 38/10; B32B 43/006; Y10T 156/1111; Y10T 156/1116; Y10T 156/1137; Y10T 156/1153; Y10T 156/1158; Y10T 156/1184; Y10T 156/1911; Y10T 156/1917; Y10T 156/1939; Y10T 156/1967
USPC ........ 156/703, 704, 708, 711, 712, 717, 752, 156/753, 757, 762, 930, 941
See application file for complete search history.

(56) References Cited

U.S. PATENT DOCUMENTS 5,986,726 A * 11/1999 Murai ............... G02F 1/133308
                                                                349/59
6,111,062 A *  8/2000 Shirota ...................... C08F 8/22
                                                                525/326.2
(Continued)

FOREIGN PATENT DOCUMENTS

JP         2016219143 A  * 12/2016  .......... H01M 2/0257

OTHER PUBLICATIONS

C. Landesberger, S. Scherbaum, K. Bock, Carrier techniques for thin wafer processing, CS MANTECH Conference, May 14-17, 2007, pp. 33-36, Austin, Texas, USA.

*Primary Examiner* — Mark A Osele
*Assistant Examiner* — Nickolas R Harm
(74) *Attorney, Agent, or Firm* — Guosheng Wang; United States Research and Patent Firm

(57) ABSTRACT

The present invention provides a support for temporary bonding a workpiece such as a thick device wafer. The support comprises a carrier having a supporting surface and an isolation film. A first side of the isolation film is bonded to the supporting surface with a peeling strength of from 0.01 to 50.0 g/cm. The invention also provides a method of using the support to e.g. grind the workpiece in making thinned products such as thin silicon wafer, optical lens, thin LCD glass, and thin rock crystal wafer, among others.

18 Claims, 7 Drawing Sheets

(51) Int. Cl.
  *B05D 1/02* (2006.01)
  *B05D 1/18* (2006.01)
  *B05D 1/30* (2006.01)
  *B05D 1/32* (2006.01)
  *B05D 1/00* (2006.01)
  *H01L 21/683* (2006.01)
  *H01L 23/15* (2006.01)
  *B32B 38/10* (2006.01)

(52) U.S. Cl.
  CPC ...... *H01L 23/15* (2013.01); *H01L 2221/6834* (2013.01); *H01L 2221/68318* (2013.01); *H01L 2221/68327* (2013.01); *H01L 2221/68381* (2013.01); *Y10T 156/1111* (2015.01); *Y10T 156/1116* (2015.01); *Y10T 156/1137* (2015.01); *Y10T 156/1153* (2015.01); *Y10T 156/1158* (2015.01); *Y10T 156/1184* (2015.01); *Y10T 156/1911* (2015.01); *Y10T 156/1917* (2015.01); *Y10T 156/1939* (2015.01); *Y10T 156/1967* (2015.01)

(56) References Cited

U.S. PATENT DOCUMENTS

| | | | |
|---|---|---|---|
| 6,235,842 B1* | 5/2001 | Kuwano | C08L 13/00 428/413 |
| 8,443,863 B2 | 5/2013 | Nishimoto et al. | |
| 8,470,129 B1 | 6/2013 | Wang | |
| 2002/0157794 A1 | 10/2002 | Yanagita et al. | |
| 2003/0047280 A1 | 3/2003 | Takayama et al. | |
| 2003/0152855 A1* | 8/2003 | Drappel | G03G 5/142 430/60 |
| 2004/0043232 A1* | 3/2004 | Sakayori | B32B 27/34 428/473.5 |
| 2006/0228650 A1* | 10/2006 | Matsuo | B23K 26/38 430/311 |
| 2007/0054436 A1 | 3/2007 | Hirakata et al. | |
| 2007/0064180 A1* | 3/2007 | Hasegawa | G02F 1/133504 349/112 |
| 2007/0134849 A1* | 6/2007 | Vanfleteren | H01L 23/5389 438/123 |
| 2007/0190251 A1* | 8/2007 | Abe | C09D 5/20 427/258 |
| 2007/0298271 A1* | 12/2007 | Liu | B32B 7/12 428/480 |
| 2009/0122236 A1* | 5/2009 | Shutou | G02F 1/13363 349/96 |
| 2010/0038035 A1 | 2/2010 | Noda et al. | |
| 2010/0147958 A1* | 6/2010 | Martinent | G06K 19/027 235/492 |
| 2010/0243159 A1 | 9/2010 | Nishio et al. | |
| 2010/0281787 A1* | 11/2010 | Jay | E06B 1/62 52/58 |
| 2010/0291377 A1* | 11/2010 | Takabayashi | C08G 73/10 428/334 |
| 2010/0313667 A1* | 12/2010 | Terada | B32B 27/18 73/754 |
| 2011/0166594 A1* | 7/2011 | Eull | A61F 5/08 606/201 |
| 2012/0118352 A1* | 5/2012 | Asami | H01L 31/048 136/246 |
| 2012/0256872 A1* | 10/2012 | Kawaguchi | G06F 3/0416 345/174 |
| 2013/0071596 A1* | 3/2013 | Horiuchi | B26D 3/08 428/40.1 |
| 2013/0084459 A1 | 4/2013 | Larson et al. | |
| 2013/0130015 A1* | 5/2013 | Cosentino | B32B 27/205 428/315.9 |
| 2013/0192754 A1* | 8/2013 | Dukkipati | H01L 21/02 156/308.2 |
| 2013/0206331 A1 | 8/2013 | Ho et al. | |
| 2013/0292062 A1 | 11/2013 | Iwashita et al. | |
| 2014/0020847 A1 | 1/2014 | Burggraf et al. | |
| 2014/0120301 A1* | 5/2014 | Jordan | B32B 7/12 428/106 |
| 2014/0130851 A1* | 5/2014 | Osamura | B32B 25/18 136/251 |
| 2014/0178701 A1 | 6/2014 | Dukkipati et al. | |
| 2014/0213703 A1* | 7/2014 | Amasaki | C07D 409/14 524/100 |
| 2014/0239453 A1 | 8/2014 | Puligadda et al. | |
| 2016/0009946 A1* | 1/2016 | Kitagawa | G03F 7/0002 264/447 |
| 2016/0026061 A1* | 1/2016 | O'Keeffe | G02F 1/167 359/296 |
| 2016/0336548 A1* | 11/2016 | Kobayashi | H01M 2/0257 |
| 2017/0100926 A1* | 4/2017 | Kano | B32B 9/02 |
| 2017/0152395 A1* | 6/2017 | Fukumura | C09D 5/002 |
| 2017/0192130 A1* | 7/2017 | Liu | B32B 7/12 |

\* cited by examiner

SUPPORT FOR BONDING A WORKPIECE AND METHOD THEREOF

CROSS-REFERENCE TO RELATED U.S. APPLICATIONS

This application claims the benefit of priority under 35 U.S.C. 119(a) and the Paris Convention based on Chinese Application No. 201410766550.4 and International Patent Application No. PCT/CN2014093716, both of which were filed on Dec. 12, 2014. The entire contents of the patent applications are incorporated by reference in its entirety.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention generally relates to a support or platform for holding/mounting a workpiece made of any brittle material, such as semiconductor wafers e.g. silicon and gallium arsenide, a rock crystal wafer, sapphire and glass.

The invention further relates to a method of using the support to make products such as optical lens, thin silicon wafer, thin LCD glass, thin rock crystal wafer, thin metal plate, thin crystal disk, and thin solid membrane, film or filter, among others. For example, the invention may be used to support a device wafer during wafer thinning and other backside processing.

BACKGROUND OF THE INVENTION

Thick wafers cause an increase in capacitance, requiring thicker transmission lines, and, in turn, a larger IC footprint. In contrast, thinned wafers have the benefits of reduction in transmission line thickness, IC miniaturization, improved heat dissipation, and realization of stacked configuration in packaging. Stacked configuration is particularly useful for compact electronic products such as cellular telephones. By stacking and interconnecting devices vertically, device interconnection density and corresponding reductions in signal delay (as a result of shortening the distance between electrical connection points) can be significantly increased.

Silicon wafers used in high-volume integrated circuit production are typically 200 or 300 mm in diameter and have a through-wafer thickness of about 750 microns. Without thinning, it would be nearly impossible to form backside electrical contacts that connect with front-side circuitry by passing the connections through the wafer. Highly efficient thinning processes for semiconductor-grade silicon and compound semiconductors based on mechanical grinding (back-grinding) and polishing as well as chemical etching are now in commercial use. These processes allow device wafer thickness to be reduced to less than 100 microns in a few minutes while maintaining precise control over cross-wafer thickness uniformity.

Device wafers that have been thinned to less than 100 microns, and especially those thinned to less than 60 microns, are extremely fragile and must be supported over their full dimensions to prevent cracking and breakage. Various wafer wands and chucks have been developed for transferring ultra-thin device wafers, but the problem still exists of how to support the wafers during back-grinding and TSV-formation processes, because these steps impose high thermal and mechanical stresses on the device wafer as it is being thinned or after thinning. An increasingly popular approach to ultra-thin wafer handling involves mounting the full-thickness device wafer face down to a rigid carrier with a polymeric adhesive. It is then thinned and processed from the backside. The fully processed, ultra-thin wafer is then removed, or debonded, from the carrier after the backside processing has been completed.

To debond the device wafer from the carrier, an operator can immerse the bonded wafer stack in, spray it with, a solvent or chemical agent to dissolve or decompose the polymeric adhesive. However, this is an extremely slow process because the solvent must diffuse over large distances through the viscous polymer medium to effect release. That is, the solvent must diffuse from the edge of the bonded substrates, or from a perforation in the carrier, into the local region of the adhesive. In either case, the minimum distance required for solvent diffusion and penetration is at least 3-5 mm and can be much more, even with perforations to increase solvent contact with the adhesive layer. Treatment times of several hours, even at elevated temperatures (>60° C.), are usually required for debonding to occur, meaning wafer throughput will be low.

The operator can also irradiate the bonded wafer stack with a light source through a transparent carrier to photo-decompose the adhesive boundary layer adjacent to the carrier. The carrier can then be separated from the stack, and the balance of the polymeric adhesive is peeled from the device wafer while it is held on a chuck. However, this is again a slow process because the entire bonded substrate cannot be exposed the irradiation at one time. Instead, the exposing light source, which is usually a laser having beam cross-section of only a few millimeters, must be focused on a small area at a time to deliver sufficient energy for decomposition of the adhesive bond line to occur. The beam is then scanned (or rastered) across the substrate in a serial fashion to debond the entire surface, which leads to a long debonding time.

In another approach, the bonded wafer stack is heated above the softening temperature of the polymeric adhesive, and the device wafer is then slid or pulled away from the carrier while being supported with a full-wafer holding chuck. However, this approach also reduces device yield. Backside processes for temporarily bonded device wafers often involve working temperatures higher than 200° C. or even 300° C. The polymeric adhesives used in this approach must neither decompose nor soften excessively at or near the working temperature; otherwise, debonding would occur prematurely. As a result, the adhesives are normally designed to soften sufficiently at 20-50° C. above the working temperature for debonding to occur. The high temperature required for debonding imposes significant stresses on the bonded pair as a result of thermal expansion. At the same time, the high mechanical force required to move the device wafer away from the carrier by a sliding, lifting, or twisting motion creates additional stress that can cause the device wafer to break or produce damage within the microscopic circuitry of individual devices, which leads to device failure and yield loss.

In still another approach, the bonded wafer stack is heated above the decomposition temperature of the polymeric adhesive, causing it to volatilize and lose adhesion to the device wafer and carrier. The drawback associated with this approach is also wafer breakage. Gases are produced when the polymeric adhesive is decomposed, and these gases can become trapped between the device wafer and the carrier before the bulk of the adhesive has been removed. The accumulation of trapped gases can cause the thin device wafer to blister and crack or even rupture. Another problem is that polymer decomposition is often accompanied by the formation of carbonized residues that cannot be removed from the device wafer by common cleaning procedures.

Therefore, there exists a need for new approaches of carrier-assisted thin wafer handling that enhance the efficiency, simplify the procedure, provide high wafer throughput, and reduce or eliminate the risks for device wafer breakage and internal device damage. Advantageously, the present invention provides a solution that can meet such a need.

SUMMARY OF THE INVENTION

One aspect of the present invention provides a support for temporary bonding a workpiece comprising a carrier having a supporting surface, and an isolation film. A first side of the isolation film is bonded to the supporting surface with a peeling strength P1 in the range of from about 0.01 to about 50.0 g/cm, preferably from about 0.05 to about 10.0 g/cm, and more preferably from about 0.1 to about 5.0 g/cm, as determined by ASTM D6862. A second side of the isolation film is directly or indirectly bondable to the workpiece. The isolation film has sufficient shear properties, low peel adhesion and exhibit minimal adhesive transfer. The film can bond carrier and workpiece together with sufficient resistance to shear forces while still being easily peeled from the carrier, even after prolonged periods of time.

Another aspect of the invention provides a method of producing the aforementioned support. The method comprises providing a carrier having a supporting surface; and generating an isolation film on the supporting surface. A first side of the isolation film is bonded to the supporting surface with a peeling strength P1 in the range of from about 0.01 to about 50.0 g/cm, preferably from about 0.05 to about 10.0 g/cm, and more preferably from about 0.1 to about 5.0 g/cm, as determined by ASTM D6862. A second side of the isolation film is directly or indirectly bondable to the workpiece.

Still another aspect of the present invention provides a method of processing a workpiece using the above support. The method comprises providing the support as defined above; providing a workpiece; directly or indirectly bonding the workpiece onto a second side of the isolation film; processing the workpiece; and separating the isolation film from the supporting surface of the carrier, while the isolation film remains bonded to the workpiece. In typical embodiments, said indirectly bonding the workpiece onto a second side of the isolation film of the support is accomplished by using an adhesive layer located between the workpiece and said second side of the isolation film. Part or all of the adhesive layer and the isolation film can be removed from the workpiece in later stages.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

DETAILED DESCRIPTION OF THE PREFERRED EMBODIMENT

Figure 1:
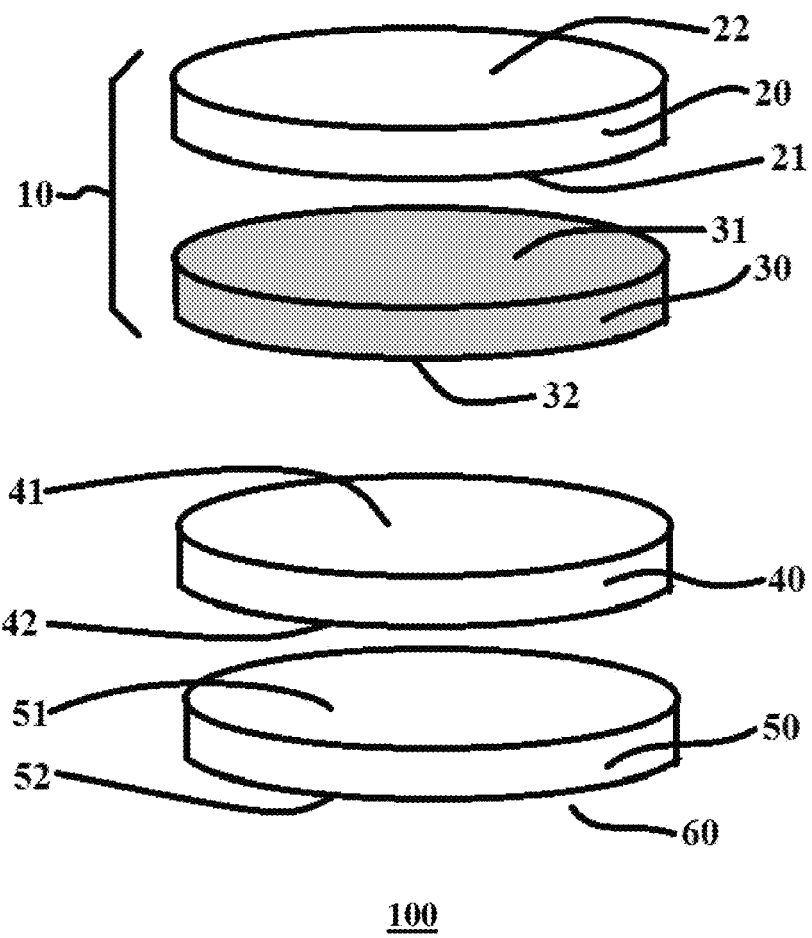
FIG. 1 shows the exploded view of a workpiece stack such as a wafer stack comprising the support of the invention in accordance with an exemplary embodiment of the present invention.

In the following description, for the purposes of explanation, numerous specific details are set forth in order to provide a thorough understanding of the present invention. It is apparent, however, to one skilled in the art that the present invention may be practiced without these specific details or with an equivalent arrangement. Embodiments of the present invention are described herein with reference to illustrations of idealized embodiments. As such, variations from the shapes of the illustrations as a result, for example, of manufacturing techniques and/or tolerances, are to be expected. There is no intent to limit the principles of the present invention to the particular disclosed embodiments. For example, in the drawings, the size and relative sizes of layers and regions may be exaggerated for clarity. In addition, embodiments of the present invention should not be construed as limited to the particular shapes of regions illustrated herein but are to include deviations in shapes that result, for example, from manufacturing. For example, a region illustrated as a rectangle may have rounded or curved features. Thus, the regions illustrated in the figures are schematic in nature and their shapes are not intended to illustrate the precise shape of a region of a device or of topography and are not intended to limit the scope of the present invention.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined. That is to say that, unless otherwise indicated, all ranges disclosed herein are to be understood to encompass any and all subranges subsumed therein. For example, a stated range of from "1 to 10" should be considered to include any and all subranges between the minimum value of 1 and the maximum value of 10. Exemplary subranges of the range 1 to 10 include, but are not limited to, 1 to 6.1, 3.5 to 7.8, and 5.5 to 10. Further, where an integer range of from "0 to 12" is provided, it will also be considered to include any and all subranges as described above.

Referring to FIG. 1, a support 10 for temporary bonding a workpiece 60 comprises (in this embodiment, consists of) a carrier 20 having a supporting surface 21 and an isolation film 30. A first side 31 of the isolation film 30 is bonded to the supporting surface 21 with a peeling strength P1 in the range of from about 0.01 to about 50.0 g/cm, preferably from about 0.05 to about 10.0 g/cm, and more preferably from about 0.1 to about 5.0 g/cm, as determined by ASTM D6862. The second side 32 of the isolation film 30 is directly or indirectly bondable to the workpiece 60.

For example, the second side 32 may be bonded directly to the workpiece 60, i.e., without any intermediate layers. Alternatively, the second side 32 may be bonded indirectly to the workpiece 60, for example, using an adhesive layer 40 located therebetween, as illustrated in FIG. 1. In this example, the second side 32 may bond to a first side 41 of the adhesive layer 40, and a second side 42 of the adhesive layer 40 may bond to the workpiece 60, to form a stack 100.

Workpiece 60 can be any suitable workpiece subject to any mechanical and/or chemical treatment(s) to make a thin or ultra-thin product, for example, optical lens, thin LCD glass, thin wafer, thin metal plate, thin crystal disk, and thin solid membrane, film or filter, among others. In the embodiment illustrated in FIG. 1, workpiece 60 is a wafer 50 (to be thinned) having an engaging surface 51 and a processing surface 52. Bonding wafer 50 onto a second side 32 of the isolation film 30 may therefore be accomplished by placing an adhesive layer 40 between the engaging surface 51 and the second side 32 of the isolation film 30. Processing of the workpiece 60 may be performed on, for example, the processing surface 52 of the wafer 50.

Wafer 50 may be any wafer known as a functional wafer or a device wafer, its engaging surface 51 may also be known as a front or device surface, and its processing surface 52 may be known as a back surface. Although the wafer 50 can be of any shape, typically it is circular in shape. Engaging surface 51 may comprise any suitable microdevices fabricated on or from semiconducting materials such as silicon, polysilicon, silicon dioxide, silicon-germanium, silicon (oxy)nitride, Gallium Nitride (GaN), gallium arsenide (GaAs), gallium phosphide (GaP), gallium arsenide phosphide (GaAsP), silicon carbide (SiC), metals (e.g., copper, aluminum, gold, tungsten, tantalum), low k dielectrics, polymer dielectrics, and various metal nitrides and silicides. Examples of device can be on or in engaging surface 51, include, but are not limited to, integrated circuits, microelectromechanical systems (MEMS), microsensors, power semiconductors, light-emitting diodes, photonic circuits, interposers, and embedded passive devices. The engaging surface 51 can also include at least one structure selected from the group consisting of solder bumps, metal posts, and metal pillars.

Carrier 20 in this embodiment is a carrier wafer, which has a supporting surface 21 (also known as front or carrier surface) and a back surface 22. Preferred carrier wafer 20 can be silicon (e.g., a blank device wafer), sapphire, quartz, metals (e.g., aluminum, copper, silver, steel), and various glasses (e.g. soda lime glass and borosilicate glass), and ceramics. The carrier material may be broadly selected from silicon, polysilicon, silicon dioxide, silicon-germanium, silicon (oxy)nitride, Gallium Nitride (GaN), gallium arsenide (GaAs), gallium phosphide (GaP), gallium arsenide phosphide (GaAsP), silicon carbide (SiC), metals (e.g., copper, aluminum, gold, tungsten, tantalum), low k dielectrics, polymer dielectrics, and various metal nitrides and silicides. Carrier 20 may be square, ellipsoid or rectangular but is more commonly round and sized to match wafer 50 so that the bonded assembly can be handled in conventional processing tools and cassettes. As an advantage of the invention, carrier 20 does not have to be perforated to speed the debonding process, because no liquid chemical agent is necessarily needed to dissolve or decompose isolation film 30.

To obtain the desired thickness uniformity after grinding of wafer 50, carrier 20 is preferred to have uniform thickness and good surface flatness (or planarity). For example, for grinding a silicon wafer to 50 µm thick or less and attaining evenness of ±10% or less, the variability in the thickness of carrier 20 should be reduced to ±2 µm or less. In the case where carrier 20 is repeatedly used, it also preferably has scratch resistance.

Figure 2:
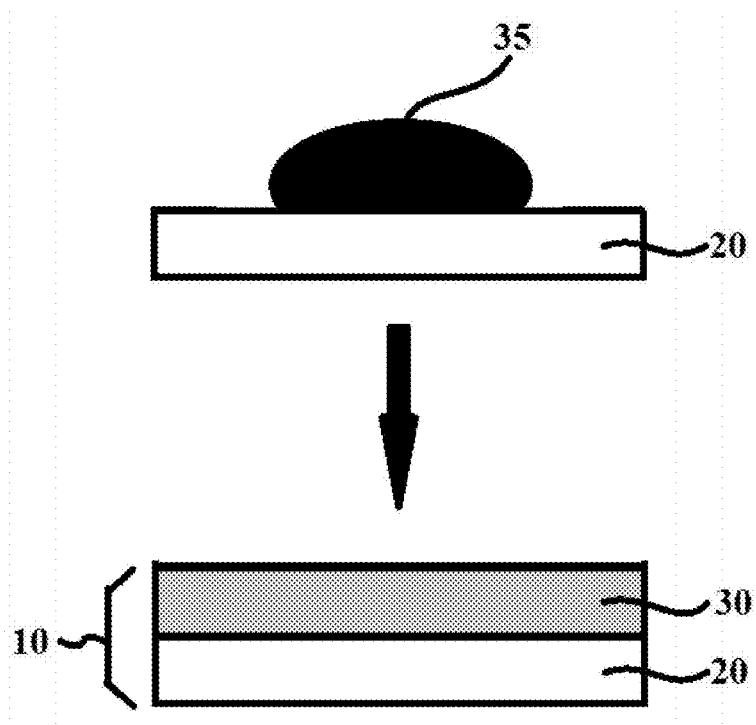
FIG. 2 depicts a process of making the support comprising a carrier and an isolation film in accordance with an exemplary embodiment of the present invention.

Referring to FIG. 2, a method of producing a support 10 for temporary bonding a workpiece 60 such as a wafer 50 (e.g. a blank wafer) is illustrated. In one step, a carrier 20 having a supporting surface 21 is provided. In another step, an isolation film 30 is generated onto the supporting surface 21. The first side 31 of the isolation film 30 is bonded to the supporting surface 21 with a peeling strength P1 in the range of from about 0.01 to about 50.0 g/cm, preferably from about 0.05 to about 10.0 g/cm, and more preferably from about 0.1 to about 5.0 g/cm, as determined by ASTM D6862.

The isolation film 30 is typically applied to supporting surface 21 by spin coating, spray coating, or laminating as dry-film tapes. However, other coating methods are also contemplated within the present invention, such as stencil printing, ink jetting, casting from solution, meniscus coating, roller coating, flow coating, dip coating, knife coating, and die coating.

Spin- and spray-applied film 30 is preferred because the coatings has higher thickness uniformity than tapes can provide. Spin coating is preferred because it is more uniform, providing smooth surface and voids free coating inside, while tapes may leave tiny voids inside adhesive layer. Higher thickness uniformity can enable greater control over cross-wafer thickness uniformity after thinning. As shown in FIG. 2, isolation film 30 may be generated by spin-coating the supporting surface 21 with a liquid material 35, and then solidifying the liquid material 35. In another embodiment, the isolation film 30 is generated by stencil printing on the supporting surface 21. The liquid material may be applied to the supporting surface 21 by any known application method, with one preferred method being spin-coating the liquid material 35 at speeds of from about 500 rpm to about 5,000 rpm, preferably from about 500 rpm to about 2,000 rpm, for a time period of from about 5 seconds to about 120 seconds, preferably from about 30 seconds to about 90 seconds. After liquid material 35 is applied, it is preferably heated to a temperature of from about 70° C. to about 350° C. for a time period of from about 60 seconds to about 8 minutes, preferably from about 90 seconds to about 6 minutes. In some embodiments, while heating liquid material 35 at a higher temperature provides more thermal stability in later processing steps, heating at a lower temperature is useful for the purpose of getting rid of solvent from the material. Depending upon the liquid material 35 used to form the isolation film 30, baking (e.g. on a hot plate) can initiate a crosslinking or polymerization reaction to cure or solidify the isolation film 30. In some embodiments, it is preferable to employ a multi-stage baking process to prepare the isolation film 30, depending on the chemical nature of the liquid material 35. Also, in some examples, the above application and baking process can be repeated on a further aliquot of the liquid material 35, so that the isolation film 30 is "built" on the supporting surface 21 in multiple steps.

The isolation film 30 so obtained may have a thickness in the range of 1 µm to 100 µm, preferably in the range of 2 µm to 50 µm, and more preferably in the range of 5 µm to 20 µm, such as 10 µm. In preferred embodiments, isolation film 30 has a shear strength that is high enough to withstand the pressure, force and stress encountered in later processing steps, for example, grinding and polishing in thinning a wafer. Generally, isolation film 30 has a shear strength of at least 1 MPa, and does not flow at later process temperatures e.g. from about 150° C. to about 400° C. Shear strength can be tested by a Shear load tester.

In some embodiments, isolation film 30 is made of polymeric materials that (A) are tack-free and not bond strongly to glass, silicon, and metal surfaces (i.e., have very low amount of, or no, hydroxyl or carboxylic acid groups); (B) can be cast from solution or formed into a thin film for lamination; and (C) will not crack, flow, or redistribute under mechanical stresses encountered during backside processing, even when carried out at high temperatures or under high vacuum conditions. Low bonding strength refers to polymeric materials that can be peeled from a substrate with only light hand pressure such as might be used to debond an adhesive note paper. Thus, any material with an adhesion strength to carrier 20 of less than about 50 psig, preferably less than about 35 psig, and more preferably from about 1 psig to about 30 psig would be desirable for use as isolation film 30 of the present invention.

Suitable materials that can be used to generate isolation film 30 include, for example, polyethersulfone, polyacrylate, polyetherimide, polyethylene naphthalate, polyethylene terephthalate, polyphenylene sulfide, polyarylate, polyimide, polycarbonate, cellulose triacetate, cellulose acetate, propionate, arylite and any combination thereof. A preferred material for isolation film 30 is polyethersulfone-containing Z-COAT 150 commercially available from Micro Materials Inc., 10080 Willow Creek Road, San Diego, Calif. 92131. Z-COAT 150 can be applied to supporting surface by spin coating or stencil printing, and be cured with step temperature profile. Tests have proved that Z-COAT 150 film can be peeled from glass at 90 degree angle with a peeling force of lower than 5 g/cm.

As an alternative to or even an improvement over polyimide, Z-COAT 150 exhibits other performance properties, for example, it remains stable and transparent at 400° C. baking, and can resist most chemicals (e.g. acids, some solvents and alkalis) used in typical FPD plants. Specifically, Z-COAT 150 demonstrates high clarity, e.g. greater than 89% transmittance at 380-800 nm range after 400° C. N2 baking; high thermal stability, e.g. glass transition temperature greater than 300° C. and thermal-mechanical stability at 50-300° C. up to 4 hours; decomposition temperature above 500° C.; and good moisture impermissibility. The tensile strength of Z-COAT 150 is higher than 600 kg/cm$^2$ at 300° C.; higher than 550 kg/cm$^2$ at 350° C.; higher than 480 kg/cm$^2$ at 400° C. (30 min); and higher than 450 kg/cm$^2$ at 400° C. (1.5 hours). The transmittance of Z-COAT 150 in 320-800 nm range is higher than 80% at 300-400° C. in 90% nitrogen atmosphere. Chemical resistance tests on Z-COAT 150 film showed that the material has a weight loss of less than 1% and exhibits substantially unchanged surface after being soaked 30-60 minutes at 25-60° C. in the following chemicals: PGMEA, 0.045% KOH, Al hydroxide, oxalic, TMAH and stripper. Z-COAT can be dissolved in cyclopetanone, NMP THF and dioxolane.

Figure 3:
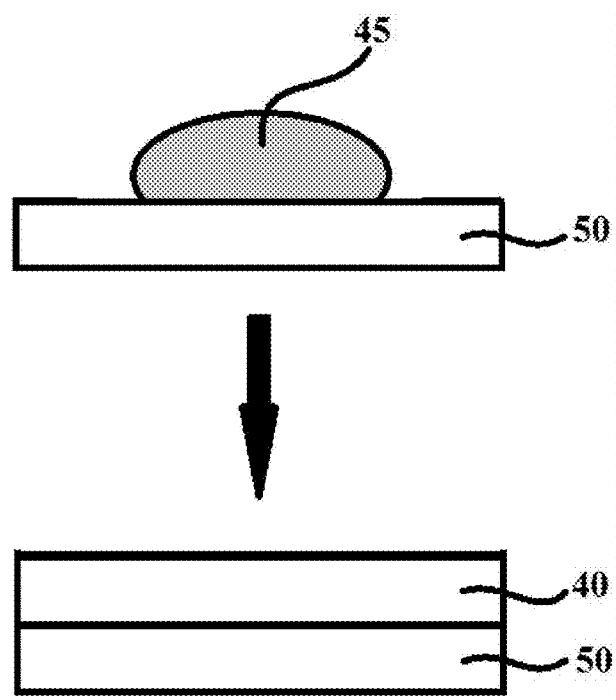
FIG. 3 illustrates the deposition of an adhesive layer onto a workpiece such as a wafer in accordance with an exemplary embodiment of the present invention.

FIG. 3 illustrates a method of forming the adhesive layer 40 and bonding it onto the workpiece 60, such as the engaging surface 51 of wafer 50. Adhesive layer 40 is typically applied by spin coating or spray coating from solution or laminating as dry-film tapes, on the engaging surface 51, the second side 32 of the isolation film 30, or both. However, other coating methods are also contemplated within the present invention, such as ink jetting, casting from solution, meniscus coating, roller coating, flow coating, dip coating, knife coating, and die coating. Spin- and spray-applied adhesives are preferred because they form coatings with higher thickness uniformity than tapes can provide. Higher thickness uniformity translates into greater control over cross-wafer thickness uniformity after thinning. The adhesive layer 40 exhibits high bonding strength at least to wafer 50, preferably to both wafer 50 and isolation film 30.

As shown in FIG. 3, the adhesive layer 40 may be generated by spin-coating the engaging surface 51 with a liquid material 45, and then solidifying the liquid material 45. The liquid material 45 may be applied to the engaging surface 51 by any known application method, e.g. spin-coating the liquid material 45 at speeds of from about 500 rpm to about 5,000 rpm, preferably from about 500 rpm to about 2,000 rpm, for a time period of from about 5 seconds to about 120 seconds, preferably from about 30 seconds to about 90 seconds.

After being applied, liquid material 45 of no solvent type (in liquid state) may be directly bonded to engaging surface 51, or the second side 32 of the isolation film 30, or both, at a relatively low temperature such as 110° C.±10° C. In another embodiment, liquid material 45 of no solvent type may be heated to a semi-solid state or viscous state, and bonded to engaging surface 51, or the second side 32 of the isolation film 30, or both, at a higher temperature such as 220° C.±10° C. In still another embodiment, liquid material 45 of solvent type may be baked to a solid state, and bonded to engaging surface 51, or the second side 32 of the isolation film 30, or both, at a higher temperature such as 220° C.±10° C. In various embodiments, liquid material 45 is heated to a temperature of from about 80° C. to about 250° C., more preferably from about 170° C. to about 220° C., for a time period of from about 60 seconds to about 8 minutes, preferably from about 90 seconds to about 6 minutes. Depending upon the liquid material 45 used to form the adhesive layer 40, baking can initiate a crosslinking or polymerization reaction to cure or solidify the adhesive layer 40. In some embodiments, it is preferable to employ a multi-stage baking process to prepare adhesive layer 40, depending on the chemical nature of the liquid material 45. Also, in some examples, the above application and baking process can be repeated on a further aliquot of the liquid material 45, so that the adhesive layer 40 is "built" on the engaging surface 51 in multiple steps. The liquid material 45 may include monomers, oligomers, or polymers dissolved or dispersed in a solvent system. Typical solvent systems will depend upon the polymer or oligomer selection. Typical solids contents of the compositions may range from about 1% to about 60% by weight, and preferably from about 3% to about 40% by weight, based upon the total weight of the composition. Examples of liquid material 45 or the polymerization product thereof may include, but are not limited to, epoxies, cyclic olefins, acrylics, silicones, styrenics, vinyl halides, vinyl esters, polyamides, polyimides, polysulfones, polyethersulfones, polyolefins, polyurethanes, ethylene-propylene rubbers, polyamide esters, polyimide esters, polyvinyl buterol, and polyacetals.

Although FIG. 3 only illustrates the spin coating on engaging surface 51, it should be appreciated that it can be on second side 32 of the isolation film 30 as well. Alternatively, a part of the adhesive layer 40 can be formed by spin coating on engaging surface 51, and the rest of adhesive layer 40 can be formed by spin coating on second side 32.

As described above, the engaging surface 51, like a landscape, may have variations in topography due to the presence of microelectronic elements, raised features, contact holes, via holes, lines, and trenches. Given a flat or planar processing surface 52, the highest region or point (e.g. solder bumps, metal posts and pillars) on the engaging surface 51 extends the farthest from processing surface 52, while the lowest is closest to the processing surface 52. In typical embodiments, the first side 41 of the adhesive layer 40 is substantially flat or planar. Therefore, the thickness TH of the adhesive layer 40 above the highest region or point (i.e. minimum thickness) is less than that the thickness TL of the adhesive layer 40 above the lowest region or point (i.e. maximum thickness). For example, minimum thickness TH may be at least about 5 μm, more preferably from about 5 μm to about 50 μm, and most preferably from about 10 μm to about 30 μm (e.g. 10-15 min); while maximum thickness TL may be at least about 24 μm, more preferably from about 45 μm to about 200 μm, and most preferably from about 50 μm to about 150 μm. In preferred embodiments, the adhesive layer 40 bonds to the engaging surface 51 with an adhesion strength of greater than about 50 psig, preferably from about 80 psig to about 250 psig, and more preferably from about 100 psig to about 150 psig, as determined by ASTM D4541/D7234.

Figure 4:
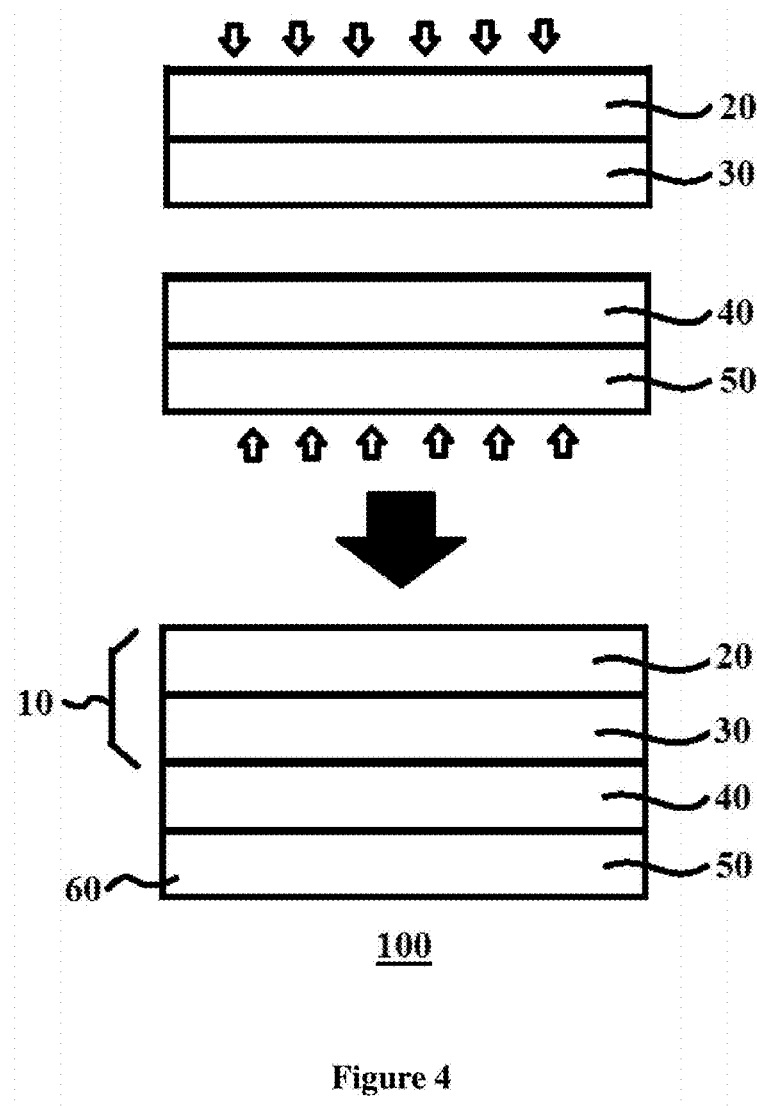
FIG. 4 illustrates the bonding of a workpiece such as a wafer onto the support using an adhesive layer located therebetween in accordance with an exemplary embodiment of the present invention.

FIG. 4 illustrates a method of forming a stack 100. The support 10 in which the supporting surface 21 and the isolation film 30 are bonded together, and the wafer 50 in which its engaging surface 51 is bonded to the adhesive layer 40, are then pressed together, so that the second side 32 of the isolation film 30 is in contact with the first side 41 of the adhesive layer 40. While pressing, sufficient pressure and heat, preferably under vacuum (e.g. 10 Pa), are applied for a sufficient amount of time so as to effect bonding of the two together to form a bonded stack 100. In some other embodiments, sufficient pressure and heat can be applied in the absence of vacuum. The bonding parameters will vary depending upon the chemical identity and properties of isolation film 30 and adhesive layer 40, but typical temperatures during this step will range from about 150° C. to about 375° C. and preferably from about 160° C. to about 350° C., with suitable bonding force, for a time period of from about 30 seconds to about 5 minutes, and more preferably from about 2 minutes to about 4 minutes. In a preferred embodiment, the bonding force of the of invention is less than about 1 Kg, while typical force needed in prior art for a 8-inch wafer is between 1 Kg to 1000 Kg.

In an exemplary embodiment, stack 100 consists of carrier wafer 20, isolation film 30, adhesive layer 40, and wafer 50 that are bonded together. The areas of supporting surface 21, first sides 31 and 41, second sides 32 and 42, as well as engaging surface 51, are substantially the same.

Figure 5:
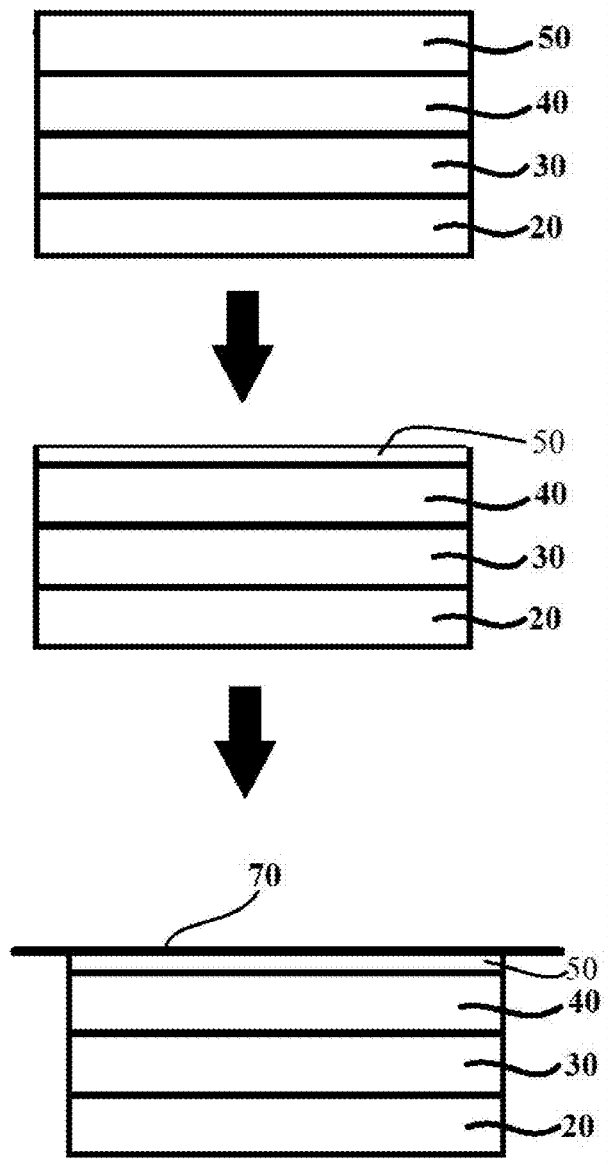
FIG. 5 demonstrates the thinning of a wafer in a slack and then attached the thinned wafer onto a dicing film in accordance with an exemplary embodiment of the present invention.

Now wafer 50 can be safely handled and subjected to further processes that might otherwise have damaged wafer without being bonded to support 10. For example, processing surface 52 can safely be subjected to thinning such as back-grinding and chemical-mechanical polishing (CMP). After thinning, other backside processing such as TSV-formation, etching such as DRIE, metal and dielectric deposition, patterning (e.g., photolithography, via etching), redistribution layers, plasma ashing, bond pads, passivation, annealing, and any combinations thereof. The processing of surface 52 is preferably completed without separation of wafer 50 and support 10 occurring, and without infiltration of any chemicals encountered during these processing steps. FIG. 5 illustrates that thinning (e.g. by grinding) of the processing surface 52 results in the thickness of wafer 50 being reduced. Once desired processing steps on surface 52 are all complete, surface 52 of the thinned wafer 50 may be bonded onto a cutting film (or dicing film) 70.

For ease of handling, original wafer 50 (before thinning) has already been processed on the engaging surface 51 (i.e., frontside devices) at their normal full-size thicknesses, e.g., 600-700 μm. After the thinning step in FIG. 5, wafer 50 is thinned to a thicknesses of 75-150 μm. For some workpiece such as hybrid substrates, e.g. gallium arsenide (GaAs) used for high-power devices, the thicknesses may be taken down to 25 μm.

In the thinning step, carrier side of stack 100 may be held in place with tooling that utilizes a vacuum chuck or some means of mechanical attachment. Mechanical thinning is performed by bringing the processing surface 52 into contact with a hard and flat rotating horizontal platter that contains a liquid slurry. The slurry may contain abrasive media along with chemical etchants such as ammonia, fluoride, or combinations thereof. The abrasive provides "gross" substrate removal, i.e., thinning, while the etchant chemistry facilitates "polishing" at the submicron level. Wafer 50 is maintained in contact with the media until an amount of the wafer material has been removed to achieve a targeted thickness.

After thinning, through-wafer electrical connections, commonly referred to as through-silicon-vias or "TSVs", can be formed on thinned wafer 50. It should be appreciated that TSV-formation processes including steps such as chemical-mechanical polishing (CMP), lithography, etching, deposition, annealing, and cleaning can also be carried on surface 52. For example, via holes can be etched on surface 52 to facilitate frontside (i.e. surface 51) contacts. In order to construct a via on wafer 50 with a thicknesses of less than 100 μm using common dry-etch techniques, the via only needs to have a diameter of 30-70 μm. Therefore, for backside processing, thin wafers can be processed more quickly and at lower cost.

The isolation film 30 and the adhesive layer 40 can survive the mechanical stress and pressure associated with the above processes. Preferably, film 30 and layer 40 can simultaneously satisfy requirements such as grinding force resistance, heat resistance during the anisotropic dry etching needed to form TSVs, chemical resistance during plating and etching, and smooth debonding of the laminated stack 100 at or near room temperature. For example, film 30 and layer 40 can survive processing temperatures up to about 450° C., preferably from about 200° C. to about 400° C., and more preferably from about 200° C. to about 350° C.

Next, the isolation film 30 may be separated from the supporting surface 21 of the carrier wafer 20, while isolation film 30 remains bonded to workpiece 60 (e.g. isolation film 30, adhesive layer 40 and processed wafer 50 remain a bonded 3-layer stack). Stack 100 may be separated by applying debonding force, typically a low mechanical force, to delaminate at the interface between supporting surface 21 and first side 31 of isolation film 30. The debonding force can be applied in a direction essentially perpendicular to supporting surface 21. It can be applied as a wedging force at an interface between carrier 20 and isolation film 30. Although it is not preferred that the debonding force is applied as a lateral force in a direction that is essentially co-planar with supporting surface 21, such embodiment remains within the scope of the present invention. The separations can all be accomplished using conventional equipment.

For example, the separation can be accomplished by simply lifting wafer 50 (or carrier 20) while maintaining carrier 20 (or wafer 50) in a substantially stationary position so as to resist the lifting force. One can also applies simultaneous opposing lifting forces to wafer 50 and carrier 20.

In an embodiment, plate chucking of a wafer stack 100 for debonding is used. Thinned wafer 50 of stack 100 can be coupled to a debonding chuck lower plate (not shown) using a wafer dicing tape or film 70, and carrier 20 can be coupled by vacuum to a debonding chuck upper plate (not shown). A force is then applied to one side of the upper plate such that carrier 20 is debonded from thinned wafer 50 leaving both film 30 and adhesive layer 40 fixed to wafer 50. The application of the force can use a wedge-off debonding mechanism. In some wedge-off debonding processes, or for manual debonding, it can be advantageous to insert a small wedge at the periphery of the interface of the carrier 20 and isolation film 30 before engaging the wedge-off mechanism or manual debonding.

Figure 6:
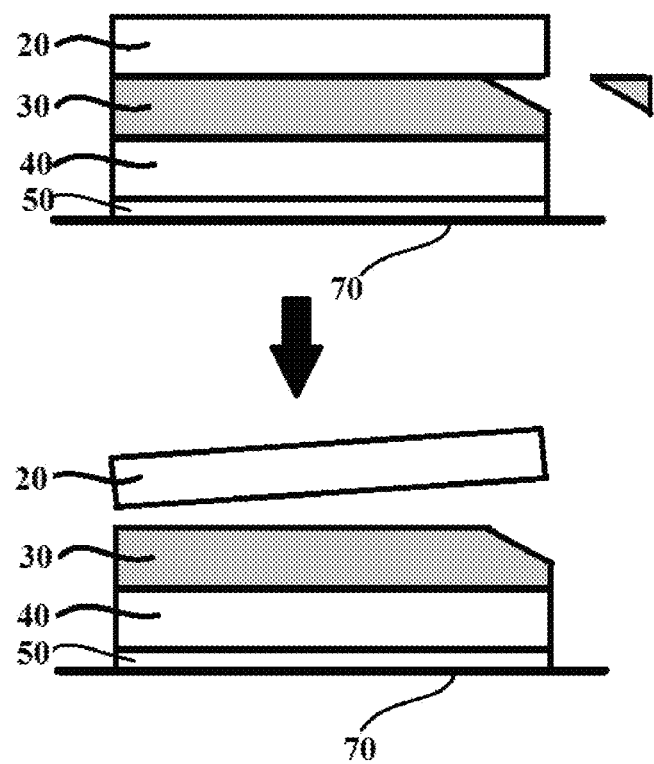
FIG. 6 shows the separation of the carrier and the isolation film using a low mechanical force in accordance with an exemplary embodiment of the present invention.

In one group of embodiments as shown in FIG. 6, an operator can first mechanically and/or chemically disrupt or destroy an outer periphery of the isolation film 30 to facilitate the later separation. For example, the operator can use a sharp tool such as knife to cut away, or use a solvent to dissolve away, a portion 38 of an outer periphery of the isolation film 30. Next, the operator can apply a low mechanical force (e.g., lifting with suction cup(s), finger pressure, gentle wedging), to separate or debond or peel off carrier 20 from the 3-layer stack (30, 40 and 50). The peeling off is easy to carry out because the first side 31 of the isolation film 30 was bonded to the supporting surface 21 with a relatively low peeling strength P1, which is in the range of from about 0.01 to about 50.0 g/cm, preferably from about 0.05 to about 10.0 g/cm, and more preferably from about 0.1 to about 5.0 g/cm, as determined by ASTM D6862.

Figure 7:
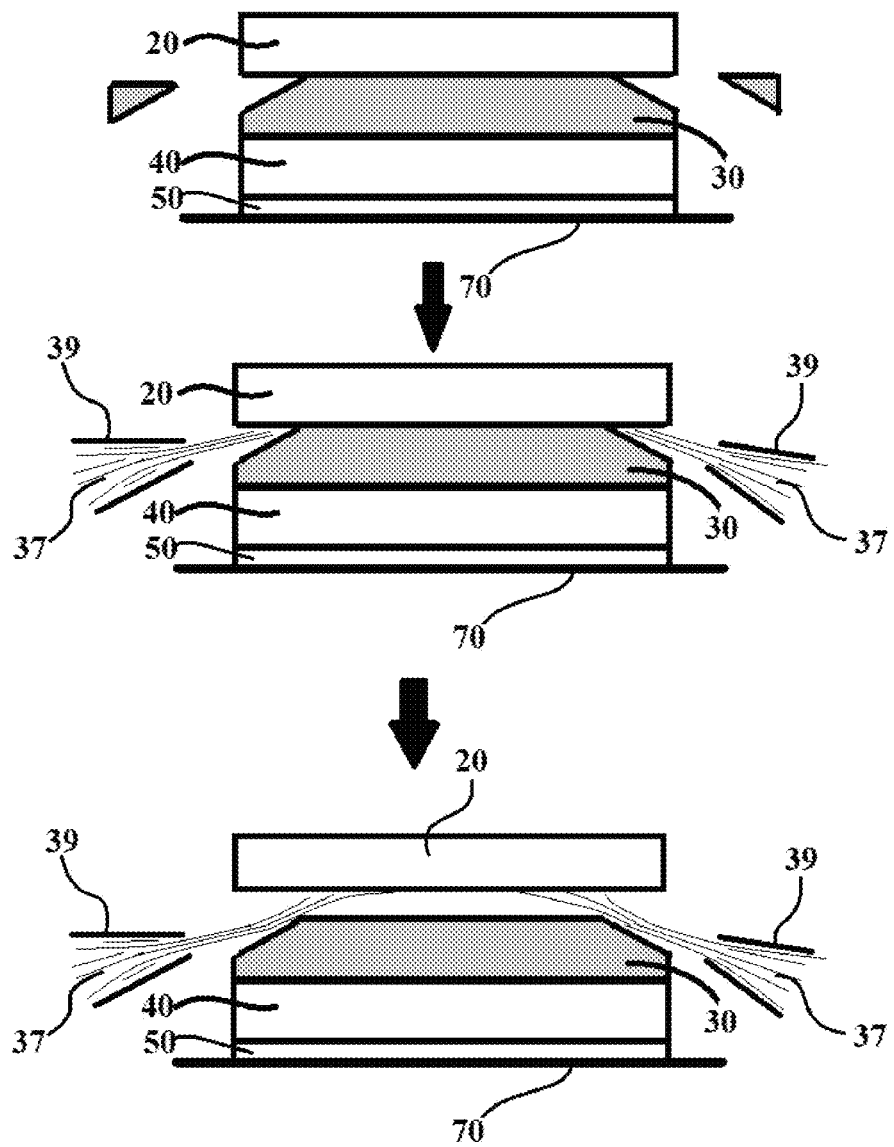
FIG. 7 shows the separation of the carrier and the isolation film using a force generated from a gas stream in accordance with an exemplary embodiment of the present invention.

In another group of embodiments as shown in FIG. 7, an operator can employ one or more gas sources 39 to blow gas jets(s) or stream(s) 37 at the junction (or joint) of carrier wafer 20 and isolation film 30. Under the force imposed from the gas jet or stream 37 pressure, carrier 20 may be blown or puffed off from the 3-layer stack (30, 40 and 50). In other embodiments, during and/or after the gas stream blowing, the user can apply an additional force on carrier 20 or the 3-layer stack to facilitate the separation of the two.

With carrier 20 being removed, the entire side of isolation film 30 and adhesive layer 40 are now completely exposed, and become easily accessible for further cleaning process. Isolation film 30 and adhesive layer 40 may be removed from the thinned wafer 50 using any known methods. For example, they can be dissolved away using a suitable solvent. Alternatively, isolation film 30 can be peeled away from adhesive layer 40 first, and reaming adhesive layer 40 is then dissolved away from wafer 50 using a solvent such as e.g., limonene, dodecene, propylene glycol monomethyl ether (PGME). Another embodiment may be to peel both isolation film 30 and adhesive layer 40 as much as possible, and then clean the residual material on wafer 50 using a solvent. In these embodiments, adhesive layer 40 is completely cleaned. However, in some other embodiments, adhesive layer 40 is designed not to be completely cleaned, i.e. leaving some residual material on the engaging surface 51. For example, the residue of adhesive layer 40 may serve some functions (e.g., gap fill) in subsequent wafer processing steps.

One way to clean wafer 50 is spin application method, in which the cleaning solvent is spin-applied continuously at about 200 to about 1,200 rpm to the spinning wafer 50 for about 1 to about 10 minutes. Alternatively, the cleaning solvent is spin-applied intermittently at about 200 to about 1,200 rpm with a frequency of about 1 to about 6 cycles/min for about 2 to about 5 minutes. This may be followed by spin-rinsing wafer 50 with a solvent at about 200 to about 1,200 rpm for about 30 to about 60 seconds, and then spin drying rapidly at about 1,500 to about 2,000 rpm for about 30 to about 60 seconds. Suitable solvents for rinsing are selected from the group consisting of water, isopropanol, 1-dodecene, acetone, methanol, ethanol, and mixtures thereof. In another embodiment, wafer 50 can be cleaned by a puddling method, in which the cleaning liquid is puddled onto wafer 50 surface and allowed to remain for about 2 to about 120 seconds. The cleaning solvent is then spun off at about 500 to about 2,000 rpm. This puddling and spinning cycle can be repeated until the residual material is dissolved away, usually about 1 to about 7 times. Wafer 50 can then be rinsed with additional solvent, and then spun dry. In still another embodiment, wafer 50 can be sprayed with the cleaning solution, followed by rinsing and drying. In still another embodiment, adhesive layer 40 can be removed by immersing wafer 50 into a cleaning solvent. Preferably, wafer 50 is immersed into the cleaning solvent for about 1 min. to about 10 min. Immersion can be repeated as needed until adhesive layer 40 is sufficiently dissolved. This can be followed by rinsing and drying wafer 50.

Thinned wafer 50, being cleaned completely or incompletely (if desired) and being bonded onto cutting film (or dicing film) 70, is now ready for further semiconductor process.

For example, thinned wafer 50 may be separated into individual devices or dies that are packaged to allow practical interconnection with a printed wiring board. It is preferred to construct the device package on or around the die while it is still part of the wafer array. This kind of wafer-level packaging reduces overall packaging costs and allows a higher interconnection density to be achieved between the device and its microelectronic environment.

Thinned wafer 50 can be easily cut and scribed into ICs. Thinner wafers have a smaller amount of material to penetrate and cut and therefore require less effort. No matter what method (sawing, scribe and break, or laser ablation) is used, ICs are easier to cut from thinner wafer 50.

With respect to the efficiency of separating the device wafer 50 and the carrier wafer 20, the present invention is advantageous over known techniques that involve laser ablation, plasma etching, water jetting, sawing or cutting etc. to etch, decompose or cleave bonding layers, since the device wafer and the carrier wafer can be readily separated by peeling off the isolation film from the carrier wafer, and one side of isolation film/adhesive layer is therefore entirely exposed for subsequent processing in a convenient way. The present invention can enhance the performance of the thin-wafer handling with lower stress in the debonding step and higher efficiency in removing boding layers, and without the sacrifice of other performances such as thermal stability, compatibility with harsh backside processing steps, protection of bumps on the front side of the wafer by encapsulation, and fewer defects on the front side.

The present invention can be widely used in many technical fields. For example, a large wafer (for example, 8 or 12 inch-diameter silicon wafer) can be readily separated from the carrier, as described above. In the field of rock crystal wafer, the thickness reduction of a wafer is required to increase the oscillation frequency. The separation can be easily accomplished when support 10 of the invention is used. In the field of liquid crystal display (LCD), the thickness reduction of the glass is desired to reduce the weight of the display and it is desired that the glass be of uniform thickness. Again, such separation can also be easily accomplished with support 10 of the invention.

Example 1

Device Wafer Coating

A silicon device wafer (i.e. workpiece 60 or wafer 50) was placed onto a vacuum chuck in a WS-400 spin coater (available from Laurell Technologies). Approximately 2 ml of Z-BOND 601 Silicone composition (available from Micro Materials Inc. (MMI), 10080 Willow Creek Road, San Diego, Calif. 92131) was needle dispensed onto the center of the wafer. The wafer was then rotated at 500 rpm for 10 seconds, 1000 rpm for 5 seconds, 2000 rpm for 10 seconds, and 600 rpm for 5 seconds, and the rotation was then stopped. The Z-BOND 601 formed a uniform wet layer on the device wafer after the spin coating. The thickness of the wet Z-BOND 601 layer (i.e. adhesive layer 40) is about 15 μm.

Example 2

Carrier Wafer Coating and Formation of Support 10

A silicon dummy wafer was used as the carrier wafer, and it was placed onto a vacuum chuck in a WS-400 spin coater. Approximately 2 ml of Z-COAT 150 polyethersulfone composition (available from Micro Materials Inc., 10080 Willow Creek Road, San Diego, Calif. 92131) was needle dispensed onto center of the carrier wafer. Then wafer was rotated at 700 rpm for 5 seconds, 1500 rpm for 10 seconds, and 500 rpm for 5 seconds, before the rotation was stopped. The Z-COAT 150 formed a uniform wet layer on the carrier wafer after the spin coating. The thickness of the wet Z-COAT 150 layer right after the spin coating is approximately 12 μm.

The carrier with wet Z-COAT 150 layer was then placed on a hot plate of 80° C. for 10 minutes. The Z-COAT 150 started to form a dry layer on the carrier wafer during the heating. Carrier was then moved to a second hot plate of 200° C. for 7 minutes, then to third hot plate of 350° C. for 10 minutes, to get rid of any residual solvent. A solid transparent Z-COAT 150 layer was formed on the carrier wafer as isolation film 30. The final thickness of the film is 8 μm.

Example 3

Wafer Bonding and Thermal Stability

The wafer bonder used in this example is Z-BT200 bonder commercially available from Micro Materials Inc., 10080 Willow Creek Road, San Diego, Calif. 92131. Support 10 from Example 2 in which the supporting surface 21 and the isolation film 30 are bonded together, and wafer 50 from Example 1 in which its engaging surface 51 is bonded to the adhesive layer 40, are then pressed together; so that the second side 32 of the isolation film 30 is in contact with the first side 41 of the adhesive layer 40. The bonding was conducted at a temperature of 120° C. with 1 kg force applied for 4 minutes in vacuum of 0.1 millibars to form a bonded wafer stack 100. The wafer stack was visually inspected and no voids were observed. Thermal stability was evaluated by placing a bonded wafer stack on to a hot plate set to 350° C., after which the wafer stack were visually inspected, and no blister, crack, rupture, color change or other visual defects on the carrier or wafer was observed.

Example 4

Wafer Debonding—Wedge-off

Wafer stack 100 that has been thinned was separated using manual wafer debonder Z-D200 commercially available Micro Materials Inc., 10080 Willow Creek Road, San Diego, Calif. 92131. First, the thinned device wafer was laminated on an Adwill D175 wafer dicing film (available from Lintec) on a metal frame. The laminated wafer stack was placed on Z-D200 with carrier wafer facing up. A sharp blade was manually aligned to the interface between isolation film and carrier wafer with the aid of microscope magnification set at 200×. The blade was then pushed toward the interface until it inserted about 2 mm in between the isolation film and carrier wafer. A heavy duty suction cup (available from Amazon Powerbookmedic) was then placed sucking on the carrier wafer surface. An operator then peeled off the carrier wafer from the device wafer at the point of blade insertion with little effort, or easily. The isolation film was left on the device wafer afterwards.

Example 5

Wafer Debonding—Gas Jetting

Wafer stack 100 was separated using automatic Wafer Debonder Z-D200A commercially available from Micro Materials Inc., 10080 Willow Creek Road, San Diego, Calif. 92131. First, the thinned device wafer was laminated on a wafer dicing film (Adwill D175, available from Lintec) on a metal frame. The laminated wafer stack was placed in Z-D200A with carrier wafer facing up. A sharp blade was automatically aligned to the interface between isolation film and carrier wafer by machine recognition. The blade is designed to have a controlled compressed gas channel. The blade was controlled to move toward the interface until it touched the interface, and then the blade was inserted 0.3 mm further in between the isolation film and the carrier wafer. A stream of high flow compressed gas was shoot (or blew) from the channel in the blade toward the gap between the isolation film and support carrier wafer for about 10 seconds. The device wafer was then completely separated from the carrier wafer.

Example 6

Wafer Cleaning

In the 3-layer stack obtained from Examples 4 and 5, isolation film 30, adhesive layer 40 and processed wafer 50 remained bonded together. In this example, the isolation film was peeled off from adhesive layer completely. Then the device wafer with the adhesive layer was placed in a 60° C. heated bath of Z-CLEAN 901 (commercially available from Micro Materials Inc., 10080 Willow Creek Road, San Diego, Calif. 92131) for 20 minutes. Adhesive layer was then completed removed from the device wafer. Following up was rinsing with isopropyl alcohol to finish the wafer cleaning.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A support for temporary bonding a workpiece comprising:
   a carrier having a supporting surface, and
   an isolation film comprising polyacrylate;
   wherein a first side of the isolation film is bonded to the supporting surface with a peeling strength P1 in the range of from 0.01 to 50.0 g/cm, as determined by ASTM D6862;
   wherein a second side of the isolation film is directly bonded to the workpiece; and
   wherein said carrier is made of a material selected from silicon and glass.

2. The support according to claim 1 bonded with a workpiece,
   wherein said workpiece is one of a silicon wafer, a device wafer, an optical lens, a rock crystal wafer, a metal plate, and a crystal disk.

3. The support according to claim 1, wherein said carrier is a silicon wafer.

4. The support according to claim 1, wherein said isolation film has a thickness in the range of 1 μm to 100 μm.

5. A method of preparing a support of claim 1, which comprises:
   providing a carrier having a supporting surface; and
   generating an isolation film on the supporting surface, wherein a first side of the isolation film is bonded to the supporting surface with a peeling strength P1 in the range of from 0.01 to 50.0 g/cm, as determined by ASTM D6862,
   wherein the isolation film comprises polyacrylate,
   wherein a second side of the isolation film is directly bonded to the workpiece; and
   wherein said carrier is made of a material selected from silicon and glass.

6. The method according to claim 5, wherein said generating the isolation film on the supporting surface is carried out by spin coating, stencil printing, spray coating, laminating, ink jetting, casting from solution, meniscus coating, roller coating, flow coating, dip coating, knife coating, and die coating.

7. The method according to claim 5, wherein said generating the isolation film is carried out by spin coating a polyacrylate-containing liquid material on a silicon wafer as the carrier, and then solidifying the liquid material.

8. A method of processing a workpiece, comprising:
   providing a support of claim 1;
   providing a workpiece;
   directly bonding the workpiece onto a second side of the isolation film;
   processing the workpiece; and
   separating the isolation film from the supporting surface of the carrier, while the isolation film remains directly bonded to the workpiece,
   wherein the isolation film comprises polyacrylate, and
   wherein said carrier is made of a material selected from silicon and glass.

9. The method according to claim 8, further comprising removing the isolation film from the workpiece.

10. The method according to claim 8, wherein said workpiece is being processed to make a product selected from optical lens, silicon wafer, LCD glass, rock crystal wafer, metal plate, crystal disk, and solid membrane, film or filter.

11. The method according to claim 8, wherein said workpiece is a wafer having an engaging surface directly bonded to said second side of the isolation film.

12. The method according to claim 11, wherein said engaging surface comprises microdevices fabricated on or from semiconducting materials such as silicon, polysilicon, silicon dioxide, silicon-germanium, silicon (oxy)nitride, Gallium Nitride (GaN), gallium arsenide (GaAs), gallium phosphide (GaP), gallium arsenide phosphide (GaAsP), silicon carbide (SiC), metals such as copper, aluminum, gold, tungsten, tantalum, low k dielectrics, polymer dielectrics, and various metal nitrides and silicides, and wherein the microdevices are selected from integrated circuits, microelectromechanical systems (MEMS), microsensors, power semiconductors, light-emitting diodes, photonic circuits, interposers, embedded passive devices, solder bumps, metal posts, and metal pillars.

13. The method according to claim 11, wherein said wafer having a processing surface, wherein said processing the workpiece comprises processing the processing surface of the wafer, and wherein said processing comprises grinding, polishing, TSV-formation, chemical-mechanical polishing, etching, metal and dielectric deposition, patterning, passivation, annealing, and any combination thereof.

14. The method according to claim 13, further comprising a step of bonding the processing surface of the wafer onto a cutting film (or dicing film) prior to separating the isolation film from the supporting surface of the carrier.

15. The method according to claim 14, further comprising mechanically and/or chemically disrupting or destroying an outer periphery of the isolation film before the step of separating the isolation film from the supporting surface of the carrier.

16. The method according to claim 15, wherein separating the isolation film from the supporting surface of the carrier is carried out by applying a mechanical force on the carrier.

17. The method according to claim 15, wherein separating the isolation film from the supporting surface of the carrier is carried out by applying a gas jet at the junction between the isolation film and the supporting surface.

18. The method according to claim 14, further comprising removing the isolation film and the adhesive layer from the engaging surface of the wafer.

\* \* \* \* \*